United States Patent [19]

Hoefman

[11] Patent Number: 4,549,148

[45] Date of Patent: Oct. 22, 1985

[54] PULSE CORRECTOR FOR PHASE COMPARATOR INPUTS

[75] Inventor: Marc E. M. Hoefman, St.Niklaas, Belgium

[73] Assignee: International Standard Electric Corporation, New York, N.Y.

[21] Appl. No.: 561,764

[22] Filed: Dec. 16, 1983

[51] Int. Cl.[4] .................. H03L 7/10; H03D 13/00; H03K 5/22
[52] U.S. Cl. ...................... 331/1 A; 331/25; 331/27; 328/133; 328/134; 328/155; 307/516
[58] Field of Search ................... 331/1 A, 25, 27; 328/133, 134, 155; 307/516

[56] References Cited

U.S. PATENT DOCUMENTS

| | | | |
|---|---|---|---|
| 4,017,806 | 4/1977 | Rogers | 331/1 A |
| 4,326,173 | 4/1982 | Newman | 331/1 A |
| 4,365,210 | 12/1982 | Harrington et al. | 331/1 A |
| 4,423,520 | 12/1983 | Murayama et al. | 328/155 X |

FOREIGN PATENT DOCUMENTS

| | | | |
|---|---|---|---|
| 0893180 | 3/1979 | Belgium | |
| 0011128 | 5/1980 | European Pat. Off. | 331/27 |

OTHER PUBLICATIONS

Fairchild; "Phase/Frequency Detector 11C00 Series" 1975 *Fairchild Semiconductor Components Data Sheets.*

*Primary Examiner*—Eugene R. LaRoche
*Assistant Examiner*—D. C. Mis
*Attorney, Agent, or Firm*—John T. O'Halloran; Thomas P. O'Hare

[57] ABSTRACT

A pulse corrector provides circuitry for responding to first and second input pulses applied to its first and second inputs to provide first and second output pulses at the first and second outputs respectively such that the first pulse edge occurring at the first output after an interruption of the first input pulses never leads the corresponding first pulse edge occurring at the second output irrespective of the phase relationship between the corresponding first pulse edges occurring at the inputs after the interruption. Circuitry is also provided to ensure that the duration of the pulse produced at the first output and starting with the aforementioned first edge is not substantially less than that of one of the first and second input pulses, thus ensuring that a phase detector connected to the outputs of the pulse corrector is placed in a predetermined neutral state by the aforementioned pulse edges such that both its outputs are activated before reference pulses are again allowed to contact its input.

11 Claims, 4 Drawing Figures

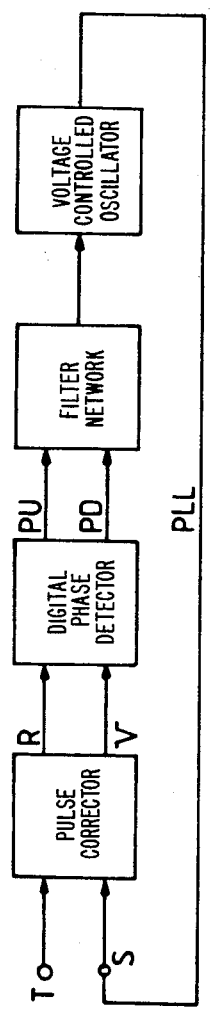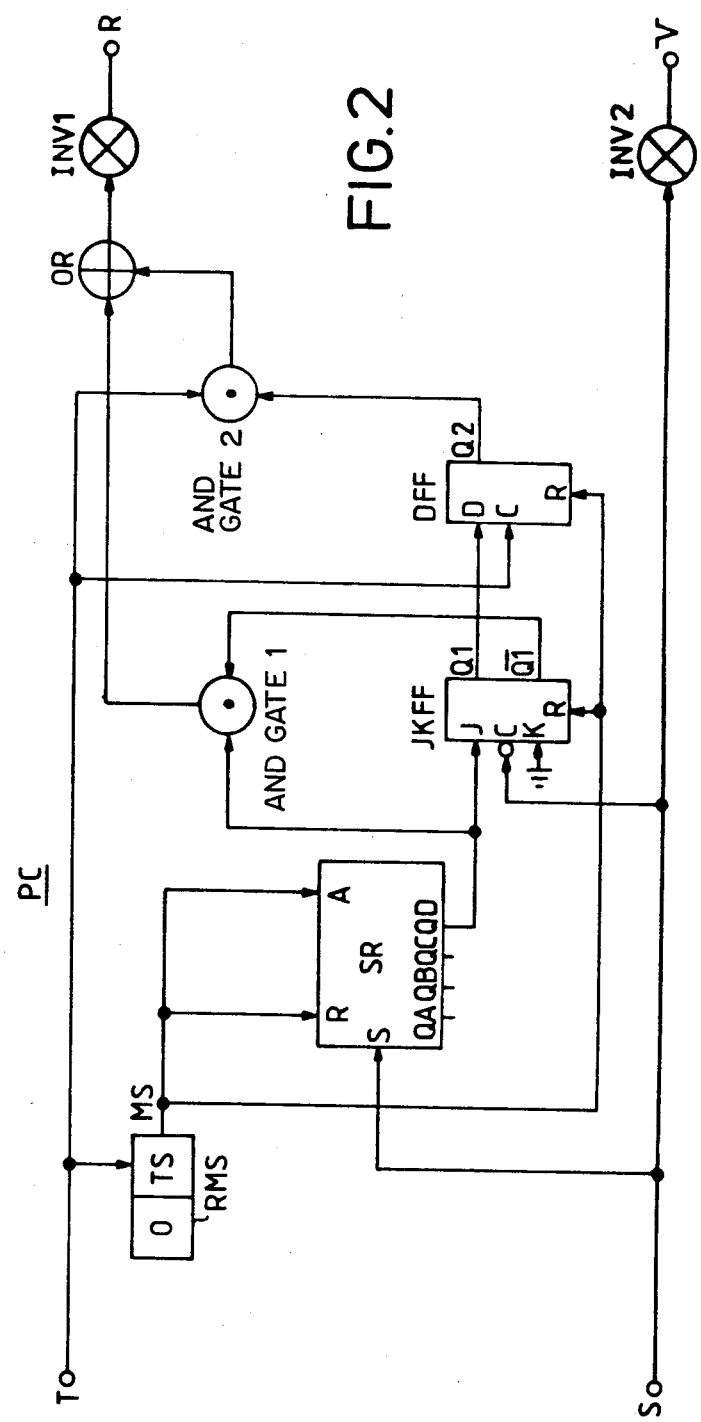

PULSE CORRECTOR FOR PHASE COMPARATOR INPUTS

The present invention relates to a pulse corrector which in response to first and second input pulses applied to its first and second inputs provides first and second output pulses at its first and second outputs respectively, the first pulse edge occurring at said first output after an interruption of said first pulses never leading the corresponding first pulse edge occurring at said second output irrespective of the phase relationship between the corresponding first pulse edges occurring at said inputs after said interruption.

Such a pulse corrector is already known from the Belgian Pat. No. 893 180 (R. BRAUN 6) and is for instance useful for a phaselocked loop incorporating a digital phase detector with its two inputs respectively connected to the first and second, or reference and comparison outputs, of the pulse corrector and with the first and second, or reference and comparison, inputs of the latter respectively connected to the output of a source of reference pulses and to the output of a voltage controlled oscillator providing comparison pulses at this output. As described in the above patent, after the end of an interruption of this source and irrespective of the phase relationship, at that moment, between the comparison pulses and the reference pulses, the pulse corrector produces at its reference output a first pulse edge which never leads the corresponding first pulse edge produced at the comparison output of this corrector. The purpose of these first pulse edges is to bring the phase detector finally in a predetermined neutral state wherein both its outputs are activated before allowing again reference pulses to its input. To be able to influence the detector, the duration of the pulse at the reference output starting with the above mentioned first edge has to be sufficiently long.

It has been found that under certain circumstances this duration can be insufficient, as will be appreciated from the following. According to the previously mentioned Belgian patent the above mentioned first pulse edge at the reference output of the corrector is produced a certain time interval after the occurrence of the first pulse edge at the reference input after the end of an interruption and also after the occurrence of the corresponding first pulse edge at the comparison input. The length of this time interval depends on the phase difference between these first pulse edges and on delays in the pulse corrector. The second pulse edge at the reference input immediately following the above mentioned first pulse edge at the same output is generated substantially immediately after the occurrence of the second pulse edge at the reference input following the above mentioned first pulse edge at the same input. Hence, the duration of the first pulse, delimited by the above first and second edges, produced at the reference output after the end of an above mentioned interruption, is dependent on the above mentioned phase difference and delays and on the duration of the corresponding first pulse at the reference input. The latter duration is itself dependent on the frequency of the reference pulses and on this first pulse being mutilated or not. Since, as mentioned above, the duration of the first pulse at the reference output of the corrector should be sufficiently long to bring the phase detector in a predetermined state, in a practical embodiment of a phaselock loop the frequency of the reference pulses had to be limited to 4 MHz.

An object of the present invention is to provide a pulse corrector of the above type but wherein the duration of the pulse at the first output starting with the first edge is substantially independent of delays in the corrector and of the phase shift between the pulses at the inputs at the end of an interruption of the first input pulses.

According to the invention this object is achieved due to the fact that the duration of the pulse produced at said first output and starting with said first edge is not substantially less than that of one of said first and second input pulses.

Another characteristic feature of the present pulse corrector is that said second output pulses are only dependent on and synchronous with said second input pulses which are not interrupted when said first input pulses are interrupted.

Still another characteristic feature of the present pulse corrector is that said pulse duration is not substantially less than that of one of said synchronous second input and output pulses, said one second output pulse starting with said first edge which substantially coincides with the first edge of said one second input pulse.

Thus the above pulse duration is substantially equal to the duration of a second input or output pulse. As the last mentioned duration is constant, the first mentioned one is independent of delays in the pulse corrector and of the phase shift, after an interruption, between the first and second input pulses. Moreover this pulse duration is also independent of mutilated pulses because the synchronous second input and output pulses are not interrupted when the first input pulses are interrupted. By using the present pulse corrector in the phaselocked loop according to the above mentioned Belgian patent, it has been possible to increase the frequency of the reference pulses at the first input from 4 MHz to 8 MHz.

The pulse corrector according to this patent further includes a monostable circuit which detects the presence or absence of pulses at the reference input and starts a pulse correcting operation when these reference pulses are absent at the input for a predetermined counted time interval. However, after such an interruption, the comparison pulses continue to appear at the comparison output as long as this time interval has not elapsed and the edges of these pulses normally bring the phase detector in a number of successive intermediate states before it is finally brought in the above mentioned neutral position by the above mentioned first edge of the first reference pulse. However, if this time interval is too small, e.g. because the monostable circuit operates with too large a tolerance, and/or if the interruption of the reference pulses at the input is shorter than this time interval, it can happen that due to an insufficient number of comparison pulse edges being applied to the detector the latter is finally not brought in its above mentioned neutral state.

Another object of the present invention is to provide a pulse corrector of the above type, but which does not present this drawback.

According to the invention this object is achieved due to the fact that it includes counting means producing said first edge of said one second output pulse when having counted a predetermined number of edges of said second input pulses after the end of said interruption of said first input pulses.

Because, as mentioned above, the second input pulses are not interrupted and the second output pulses are synchronous therewith, the counting means can always count, from the end of an interruption, a wanted number of edges of the second input pulses which then appear at the second output of the corrector as a like number of edges of second output pulses before the above mentioned first edge is produced at this first output. Hence, in case this pulse corrector is used in a phaselocked loop such as described in the above mentioned Belgian patent a correct operation is ensured independently from the operation of the monostable circuit and the duration of an interruption of the reference pulses.

The above mentioned and other objects and features of the invention will become more apparent and the invention itself will be best understood by referring to the following description of an embodiment taken in conjunction with the accompanying drawings in which:

FIG. 1 is a block diagram of a phaselock loop including a pulse corrector PC according to the invention;

FIG. 2 shows this pulse corrector PC in more detail;

The phaselock loop PLL shown in FIG. 1 comprises the cascade connection of a pulse corrector PC, a digital phase detector DPD, a filter network FN and a voltage controlled oscillator VCO. The pulse corrector PC has a reference input T connected to a source of reference pulses T (FIG. 3), a comparison input S connected to the output of the VCO producing comparison pulses S (FIG. 3) thereat, a reference output R and a comparison output V. The outputs R and V are connected to like-named inputs of the DPD which is of a type generally available on the market, e.g. MC4044 of Motorola. Phase detector DPD has outputs PU and PD which are connected to like named inputs of the filter network FN and are associated with the inputs R and V respectively.

Figure 4:
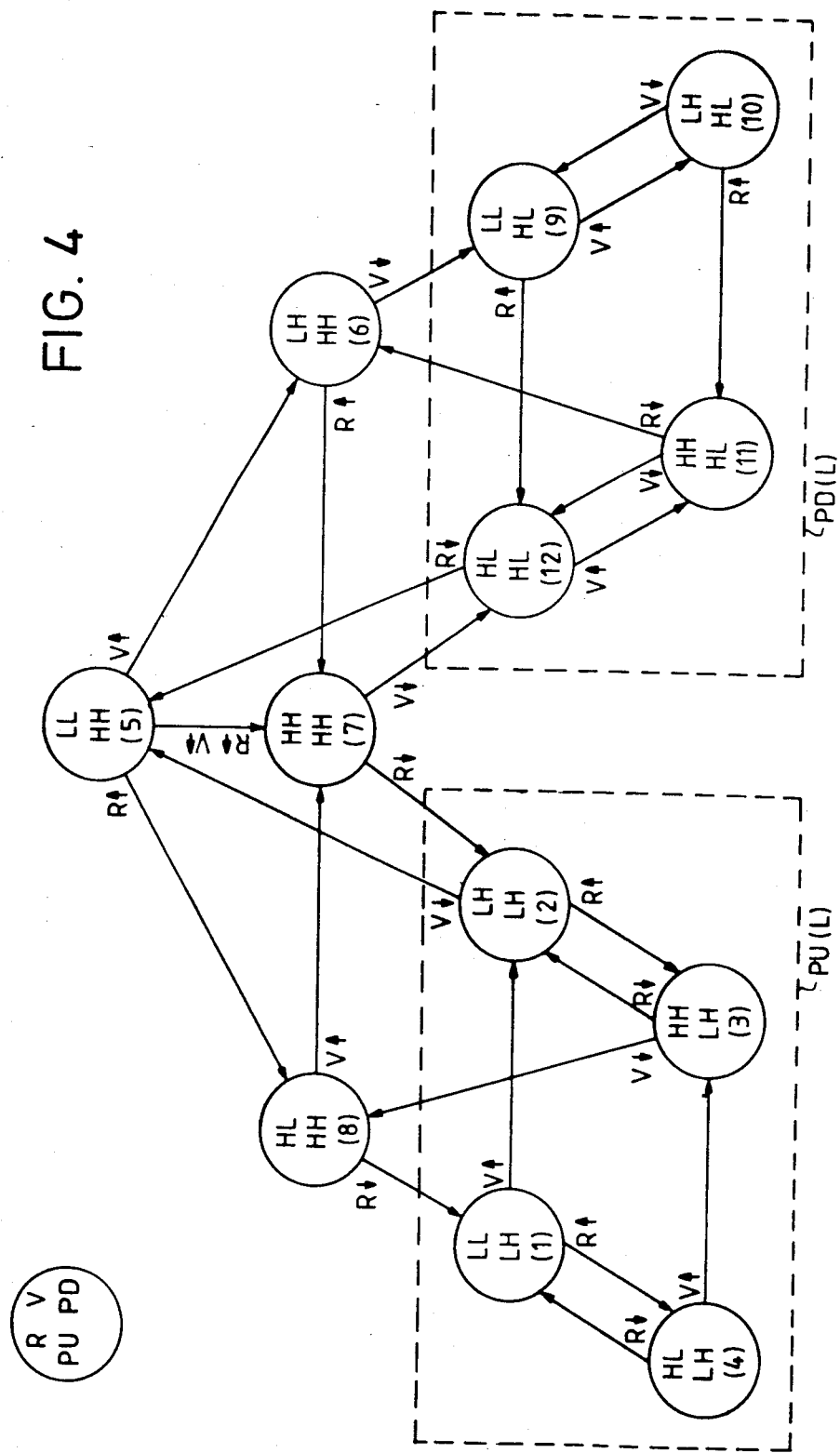
FIG. 4 represents all the possible states of the digital phase detector DPD of FIG. 1.

The twelve possible states of the phase detector are represented in FIG. 4 with in each circle (L for Low and H for High) the conditions R, V, PU and PD as indicated in the left hand upper corner of this figure. Each circle numbered from 1 to 12 indicating a particular state is connected to at least one other circle by a line terminating in an arrow indicating the state to which the particular state evolves when the signal at the input R or V varies from H to L (indicated by R ↓ or V ↓) or from L to H (indicated by R ↑ or V ↑). If an input R, V changes from H to L, the condition of the associated output PU, PD changes from H to L, if it was previously in H and does not change when it was previously in L. If an output PU, PD is in L and the condition of the non-associated input V, R changes from H to L, the condition of the output PU, PD changes from L to H. In other words, when input R changes from H to L, PU can change from H to L and PD can change from L to H, whereas when input V changes from H to L, PD can change from H to L and PU can change from L to H. PU and PD can never simultaneously be in L.

The states 5 to 8 are neutral states wherein both the outputs PU and PD are high, whilst the states 1 to 4 and 9 to 12 are active states wherein PU and PD are low respectively.

In the phaselock loop PLL the frequency and phase of the comparison pulses S of the VCO are adjusted to both the frequency and the phase of the reference pulses T. A pulse appears at the output PU whenever the phase of a pulse at input R leads the phase of a pulse at input V, and a signal appears at output PD whenever the phase of the signal at input R lags behind the phase of the signal at input V. The pulses at output PU or PD have a width proportional to this phase difference.

When the reference pulses T are interrupted, e.g. due to a failure of the reference source or because another reference source is being connected to reference input T, the phase of the reference pulses T appearing at input T after the interruption may be leading or lagging with respect to the phase of the reference pulses which were present at input T before the interruption. As explained at length in the above mentioned Belgian Pat. No. 893 180 (R. BRAUN 6), without a pulse corrector PC the phase adjustment realized by the phaselock loop is carried out in the wrong direction when the phase of the reference pulses T appearing at input T after an interruption leads the phase of the reference pulses signal which were present at input T prior to the interruption. However, by the use of the pulse corrector PC this faulty operation is obviated since it operates in such a way that the conditions of its output R, V are a function of the conditions of its input T, S and that the first edge of the reference pulses occurring at the reference output R after an interruption of the reference pulses T at the reference input T always lags behind the corresponding first edge of the comparison pulses at the comparison output V irrespective of the phase relationship between the corresponding edges at the reference and comparison inputs T and S of the pulse corrector PC at that moment.

The pulse corrector shown in FIG. 2 has a reference input T, a comparison input S, a reference output R and a comparison output V and includes a retriggerable monostable circuit RMS, a shift register SR, a negative edge triggered JK flipflop JKFF, a positive edge triggered D-flipflop DFF, AND-gates G1 and G2, OR-gate OR and inverters INV1 and INV2. All these circuits are interconnected as shown and are generally available on the market.

First, the various conditions shown in the left hand part of FIG. 3 will be explained. The monostable circuit RMS is connected to the reference input T and constitutes a detecting means for detecting the absence or presence reference pulses at this input T. Indeed, as long as such reference pulses T are present the monostable circuit RMS is triggered by each of the positive going edges of these reference pulses T so that its output MS which controls the so-called serial data input A of the shift register SR continuously remains in the H-state. By the positive going edges of the comparison pulses S the condition H is shifted through the shift register SR so that at a certain moment the output QD thereof and hence the J-input of the JKFF is brought in the H-state. By the negative going edge of S (not shown) following the positive going edge of S (also not shown) by which this J-input of the JKFF was brought in the H-condition the outputs $Q_1$ and $\overline{Q}_1$ of the JKFF are triggered to the H- and L-condition respectively. As the AND-gate G1 is controlled by the outputs QD and $\overline{Q}_1$ the output signal QD.$\overline{Q}_1$ of G1 is then in the L-state. The signal in the H-condition at the output $Q_1$ of the JKFF is registered in the D-flipflop DFF by the positive going edge (not shown) of the reference pulses T following the last mentioned negative going edge of S. As a consequence the output Q2 of the DFF is brought in the H-condition. Because the AND-gate G2 is controlled by the outputs Q2 and T the output signal Q2.T of G2 then follows the reference pulses T. The pulses at the outputs of G1 and G2 are applied to OR-gate OR and from there via inverter INV1 to reference output R on which appears a reference pulse signal $$R = \overline{QD.\overline{Q}_1 + Q_2.T} \text{ or } \overline{QD.\overline{Q}_1}.\overline{Q_2.T}$$

Figure 3:
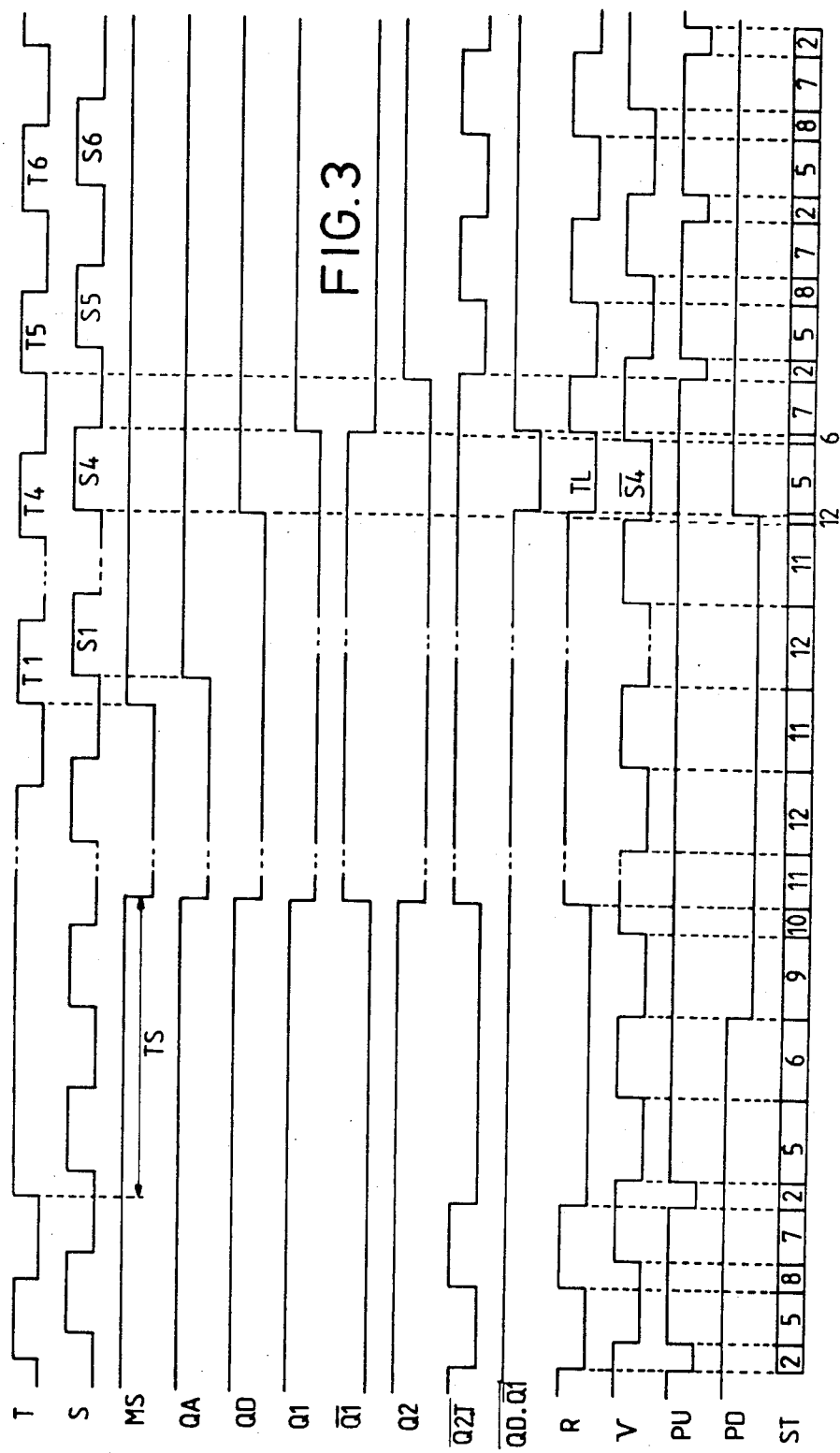
FIG. 3 represents various pulse signals appearing at various points of the pulse corrector PC of FIG. 2 and of the digital phase detector DPD of FIG. 1.

Herein $\overline{QD.\overline{Q}_1}$ and $\overline{Q_2.T}$ are the inverse of the output signals of G1 and G2 and are shown on FIG. 3. Because $QD.\overline{Q}_1$ is L and and $Q_2$ is H, $R = \overline{T}$ so that the inverse of the reference pulses T appears at the output R of PC. At the output V of the PC always appears the signal $V = \overline{S}$ i.e. the inverse of the comparison pulses S. To be noted that due to the presence of the gates G1 and G2 and the inverter INV1 the edges of R are slightly delayed with respect to those of T. The pulses at the outputs R, V of PC and at the outputs PU and PD of the DPD evolve as shown in the left hand part of FIG. 3, the corresponding states of DPD being shown on the last line ST. These states may readily be found by considering FIG. 4.

As an example it is now supposed that the reference pulses T at the reference input T are interrupted upon the occurrence of a positive going edge of T. When this interruption lasts from a time interval larger than the time constant TS the monostable circuit RMS is reset to its zero condition wherein its output MS is in L. The shift register SR and both the flipflops JKFF and DFF are then reset and the serial data input A of this shift register is brought in the L-condition. As a consequence the outputs QD, $Q_1$ and $Q_2$ are brought in the L-condition, so that the reference output R is brought in the H-condition (see the above relation). The conditions of the outputs R, V of PC and PU, PD of DPD are again shown in FIG. 3, the successive states of the DPD being again represented on the last line ST of this figure.

After the interruption of the reference pulses T is finished these pulses T have the phase shift shown with respect to the pulses R. The first positive going edge of T, i.e. the positive going edge of pulse T1, triggers the monostable circuit RMS to its unstable condition wherein its output MS is in the H-condition. Due to this, the latter H-condition is shifted through the register SR by the positive going edges of the comparison pulses S following the above mentioned first positive going edge of T, i.e. by the positive going edges of T, i.e. by the positive going edges of the pulses S1, . . . , S4, S5, . . . etc. Thus the condition of the outputs QA, . . . QD, . . . of the shift register changes to H at the positive going edges of the pulses S1, . . . S4, . . . respectively. When the condition of the output QD of SR becomes H at the positive going edges of S4, the inverse condition $\overline{QD.\overline{Q}_1}$ of the output signal $QD.\overline{Q}_1$ of the gate G1 becomes L slightly after the positive going edge of S4 due to the delay in the gate G1. Afterwards, the H-condition of the output QD is registered in the JKFF by the immediately following negative going edge of S4. Thus the condition of the outputs $Q_1$ and $\overline{Q}_1$ of the JKFF become H and L respectively so that the inverse $\overline{QD.\overline{Q}_1}$ of the condition of the output signal of AND-gate G1 again becomes H slightly after the negaive going edge of S4. The H-condition of the output $Q_1$ of the JKFF is registered in the D-flipflop DFF by the positive going edge of the reference signal T immediately following the last mentioned negative going edge of S4, i.e. by the positive going edge of T5. Thus the condition of the output Q2 of the DFF becomes H so that the inverse $\overline{Q_2.T}$ of the condition of the output signal of AND-gate G2 follows the inverse of signal T. Because the output pulses at the reference output R are equal to $\overline{QD.\overline{Q}_1}.\overline{Q_2.T}$ this signal evolves as shown in FIG. 3 and the states of the DPD evolve as shown in the last line ST of this figure and as follows from FIG. 4.

From FIG. 3 it also follows that before the inverse of the pulses T is allowed to appear on the reference output R the condition of the latter output R is made L for a time interval TL substantially equal to the duration of the pulse S4, both the edges of this time interval being slightly delayed with respect to those of S4 due to the presence of the gates G1 and G2. In other words and because $V = \overline{S}$, the first negative going edge of R (or R ↓) after an interruption always lags behind the corresponding negative going edge of V (or V ↓) by a small delay so that the outputs PU and PD of the digital phase detector DPD vary as shown in FIG. 3. Due to the duration of the negatively directed pulse TL at the output R being substantially equal to S4 one is moreover sure that the DPD will operate correctly if S4 is sufficiently long, e.g. larger than 30 milliseconds which is the minimum reaction time of the DPD used.

The purpose of the shift register SR is to ensure that after the end of an interruption a predetermined number V ↑ and V ↓ is applied to the phase detector before R ↓ is applied to it at the start of the time interval TL, all these V ↑ and V ↓ making sure that the detector evolves through a number of intermediate states and R ↓ bringing it finally in the neutral state 5. This will become clear from the following.

For the case shown in FIG. 3 one has a succession of R ↑ R ↓ V ↑ and V ↓ which is such that the DPD evolves:
from the active state 2 successively to the neutral state 5, 8 and 7;
from the start of the interruption to the end thereof, to the active state 2 and from this successively to the neutral states 5 and 6 and the active states 9, 10, 11 and 12;
from the end of the interruption alternatively from state 12 to 11 by a predetermined number of V ↑ and V ↓ counted by the shift register SR to be finally brought in the neutral state 5 by R ↓ at the start of TL. Irrespective the state of the phase detector at the end of the interruption, this predetermined number of V ↑ and V ↓ is sufficient to bring this detector in the state 12 before applying R ↓ thereat. This operation is also independent from the value of TS and the duration of the interruption;
afterwards again through the states 8, 7, 2 (except for the first time where it passes through state 6 instead of through state 8).

It should however be noted that the shift register SR synchronizes the reference pulses R, again appearing at the output R after the end of an interruption, with the comparison pulses V which were not interrupted. Instead of such a shift register SR also a counter for the pulses S could have been used.

While the principles of the invention have been described above in connection with specific apparatus, it is to be clearly understood that this description is made only by way of an example and not as a limitation on the scope of the invention.

I claim:

1. Pulse corrector which in response to first and second input pulses applied to its first and second inputs provides first and second output pulses at its first and second outputs respectively, the first pulse edge occurring at said first output after an interruption of said first input pulses never leading the corresponding first pulse edge occurring at said second output irrespective of the phase relationship between the corresponding first pulse edges occurring at said inputs after said interruption, characterized in that the duration of the pulse (TL) produced at said first output, and starting with said first pulse edge occurring at said first output after said interruption is not substantially less than that of one (S4) of said first (T) and second (S) input pulses.

2. Pulse corrector according to claim 1, characterized in that said second output pulses (V) are only dependent on and synchronous with said second input pulses (S) which are not interrupted when said first input pulses are interrupted.

3. Pulse corrector according to claim 2, characterized in that said pulse duration (TL) is not substantially less than that of one (S4,$\overline{S4}$) of said synchronous second input (S) and output (V) pulses, said one second output pulse ($\overline{S4}$) starting with said first edge which substantially coincides with the first edge of said one second input pulse (S4).

4. Pulse corrector according to claim 3, characterized in that it includes counting means (SR) producing said first edge of said one second output pulse ($\overline{S4}$) when having counted a predetermined number of edges of said second input pulses (S) after the end of said interruption of said first input pulses (T).

5. Pulse corrector according to claim 4, characterized in that it includes a retriggerable monostable circuit (RMS) having an input constituted by said first pulse corrector input and an output coupled to the data (D) and reset (R) inputs of a shift register (SR) which constitutes said counting means and further has a clock input (S) coupled to said second pulse corrector input and an output (QD) coupled to logic means (JKFF, DFF, G1, G2, OR, INV1) able to produce at said first pulse corrector output said pulse starting with said first pulse edge occurring at said first output after said interruption, the operation of said logic means being started when said monostable circuit (RMS) has detected the re-appearance of first input pulses at the end of said interruption and when said shift register has counted said predetermined number of edges of said second input pulses and has accordingly activated its said ouput (QD).

6. Pulse corrector according to claim 5, characterized in that said logic means include first memory means (JKFF), second memory means (DFF) and gating means (G1, G2, OR), said first memory means (JKFF) being able to register said activated condition of said shift register output (QD) under the control of an edge (S4↓) of said second input pulses following said counted predetermined number, said second memory means (DFF) being coupled to an output (Q1) of said first memory means (JKFF) and being able to store the registered condition (Q1) of said first memory means (JKFF) under the control of an edge (T5↑) of said first input pulses (T) following said following edge (S4↓) of said second input pulses, and said gating means (G1, G2, OR, INV1) being coupled to outputs (QD, $\overline{Q1}$, Q2) and said shift register and of said first and second memory means and to said first pulse corrector input (T) and having an output coupled to said first pulse corrector output (R), said gating means producing a first output signal $$R = \overline{QD \cdot \overline{Q_1} \cdot \overline{Q_2} \cdot T}$$

wherein:
QD is said condition of said shift register output;
$Q_1$ is an output of said first memory means;
$Q_2$ is an output of said second memory means;
T is said first pulse corrector input.

7. Pulse corrector according to claim 6, characterized in that said first memory means is a JK-flipflop (JKFF) having a J-input coupled to said shift register output (QD), a clock input (C) coupled to said second pulse corrector input and an output ($\overline{Q1}$) which together with said shift register output (QD) is coupled to a first gating circuit (G1) which forms part of said gating means and has an output coupled to said first pulse corrector output (R).

8. Pulse corrector according to claim 6, characterized in that said second memory means is a D-flipflop (DFF) having a clock input (C) coupled to said first pulse corrector input and an output (Q2) which together with said first pulse corrector input is coupled to a second gating circuit (G2) which also forms part of said gating means and has an output coupled to said first pulse corrector output (R).

9. Pulse corrector according to claim 1, characterized in that said second pulse corrector input is connected to said second pulse corrector output via an inverter (INV2).

10. Pulse corrector according to claim 1 characterized in that it forms part of a phaselocked loop (PLL) which further includes a digital phase detector (DPD) having two inputs (R, V) coupled to said outputs of said pulse corrector (PC) and two outputs (PU, PD) coupled to a controller oscillator providing said second output pulses (V) at its output which is coupled to said second input of said pulse corrector to the first input of which said first input pulses are applied from a reference source.

11. Phase detector arrangement including a pulse corrector with first and second inputs and with first and second outputs coupled to first and second inputs of a digital phase detector, said pulse corrector in response to first and second input pulses applied to said first and second inputs providing first and second output pulses at said first and second outputs respectively, the first pulse edge of a first pulse occurring at said first output after an interruption of said first input pulses never leading the corresponding first pulse edge occurring at said second output irrespective of the phase relationship between the corresponding first pulse edges occurring at said inputs after said interruption, characterized in that said pulse corrector (PC) includes counting means (SR) producing said corresponding first pulse edge at said second output when having counted a predetermined number of edges of said second input pulses (S) after the end of said interruption of said first input pulses (T) and characterized in that it includes a retriggerable monostable circuit (RMS) having an input constituted by said first pulse corrector input and an output coupled to the data (D) and reset (R) inputs of a shift register (SR) which constitutes said counting means and further has a clock input (S) coupled to said second pulse corrector input and an output (QD) coupled to logic means (JKFF, DFF, G1, G2, OR, INV1) able to produce at said first pulse corrector output said pulse starting with said first pulse edge occurring at said first output after said interruption, the operation of said logic means being started when said monostable circuit (RMS) has detected the re-appearance of first input pulses at the end of said interruption and when said shift register has counted said predetermined number of edges of said second input pulses and has accordingly activated its said output (QD).

* * * * *